United States Patent [19]

Fujiwara et al.

[11] Patent Number: 5,291,151
[45] Date of Patent: Mar. 1, 1994

[54] SENSOR AMPLIFIER

[75] Inventors: Akihiro Fujiwara; Takashi Amikura; Toru Ohara; Yasuhiro Tamekuni, all of Kanagawa, Japan

[73] Assignee: Canon Kabushiki Kaisha, Tokyo, Japan

[21] Appl. No.: 74,017

[22] Filed: Jun. 9, 1993

Related U.S. Application Data

[63] Continuation of Ser. No. 820,973, Jan. 15, 1992, abandoned.

[30] Foreign Application Priority Data

Jan. 19, 1991 [JP] Japan .................. 03-004766

[51] Int. Cl.⁵ .............................. H03G 3/00
[52] U.S. Cl. ...................... 330/282; 330/86
[58] Field of Search ............ 330/282, 86, 260, 254

[56] References Cited

U.S. PATENT DOCUMENTS

| | | | |
|---|---|---|---|
| 4,441,080 | 4/1984 | Saari | 330/86 |
| 4,471,324 | 9/1984 | Welland | 330/282 |
| 4,656,871 | 4/1987 | Czarnocki | 330/282 |

FOREIGN PATENT DOCUMENTS 57-170607  10/1982  Japan .................. 330/282

OTHER PUBLICATIONS

FETs in RC Network tune active filter, Delagrange, p. 76 Electronics, Dec. 7th, 1970.

Primary Examiner—Robert J. Pascal
Assistant Examiner—Tan Dinh
Attorney, Agent, or Firm—Robin, Blecker, Daley & Driscoll

[57] ABSTRACT

The present invention relates to an amplifier for amplifying an input signal. In a sensor amplifier construction according to the present invention, a series arrangement made up of a resistor and a transistor is inserted in a feedback path for an amplifier, and the collector of the transistor is connected to one input of the amplifier and a capacitor is connected between the emitter and the base of the transistor. According to the above-described arrangement, there is provided a sensor amplifier which can eliminate noise with a small-scale construction.

4 Claims, 3 Drawing Sheets

SENSOR AMPLIFIER

This is a continuation application under 37 CFR 1.62 of prior application Ser. No. 820,973, filed Jan. 15, 1992 and now abandoned.

BACKGROUND OF THE INVENTION

1. Field of the Invention

The present invention relates to a sensor amplifier for amplifying a signal output from a light receiving element.

2. Description of the Related Art

FIG. 5 is a block diagram schematically showing the construction of the electrical circuit of a general automatic focus adjustment device which utilizes a sensor amplifier.

Referring to FIG. 5, a controller 1, which consists of a microcomputer or the like, controls the sequence of the entire autofocus operation.

A solid arrow 2 represents a light emission driving signal outputted from the controller 1. A block 3 represents a light emission driving circuit 3 for causing an infrared light emitting diode which will be described later to emit infrared light intermittently. A solid arrow 4 represents a light emission driving current formed by the light emission driving circuit 3. A block 5 represents the infrared light emitting diode (hereinafter referred to as the "IRED"), and a dashed arrow 6 represents infrared light emitted from the IRED 5. A lens 7 is a projecting lens, and an infrared light beam 8 is projected through the projecting lens 7.

The light emission driving signal 2 drives the light emission driving circuit 3, and the light emission driving current 4 which is the output from the light emission driving circuit 3 is supplied to the IRED 5 to cause it to emit infrared light.

The infrared light 6 emitted by the IRED 5 is condensed by the projecting lens 7, so that the infrared light beam 8 is projected onto a subject (not shown) to form a projected beam spot thereon.

A dashed arrow 9 represents infrared reflected light of the projected beam spot from the subject. A lens 10 is a light receiving lens, and a dashed arrow 11 represents received infrared light of the infrared reflected light 9 conducted through the light receiving lens 10. Blocks 12a and 12b represent light receiving sensors, and solid arrows 13a and 13b represent light currents outputted from the respective sensors 12a and 12b. Blocks 14a and 14b represent sensor amplifiers (current-to-voltage conversion circuits), and solid arrows 15a and 15b represent the outputs of the respective sensor amplifiers 14a and 14b. Blocks 16a and 16b represent voltage amplifiers (voltage amplifying circuits), and solid arrows 17a and 17b represent the outputs of the respective voltage amplifiers 16a and 16b. A block 18 represents an addition/subtraction circuit, the addition/subtraction output of which is represented by a solid arrow 19. A block 20 represents a sync detecting circuit, the detection output of which is represented by a solid arrow 21. A block 22 represents an integration circuit, the integration output of which is represented by a solid arrow 23.

The operation of the device having the above-described construction will be described below.

The reflected infrared light 9 of the projected beam spot, which has been formed on the subject, is condensed to the received infrared light 11 by the light receiving lens 10, and the received infrared light 11 is focused onto the light receiving sensors 12a and 12b. The focused image is a real image of the beam spot which has been projected onto the subject.

A light receiving sensor assembly 12 is composed of two parts, i.e., the light receiving sensors 12a and 12b.

The light current 13a which is the output of the light receiving sensor 12a is converted into the voltage value 15a by the sensor amplifier 14a. The voltage value 15a is amplified to the voltage value 17a of sufficient magnitude by the voltage amplifier 16a, and the voltage value 17a is applied to the addition/subtraction circuit 18.

In the meantime, the light current 13b which is the output of the light receiving sensor 12b is similarly processed through the sensor amplifier 14a and the voltage amplifier 16a.

The addition/subtraction circuit 18 performs addition or subtraction on two inputs (a channel a and a channel b), and outputs the sum or difference 19. The addition/subtraction circuit 18 selects addition or subtraction in accordance with an instruction given by the controller 1.

The addition/subtraction output 19 is detected by the sync detecting circuit 20, and only the addition/subtraction output 19 obtained during the light emission of the IRED 5 is integrated by the integration circuit 22, and the integral 23 is supplied to the controller 1.

The controller 1 has an A/D conversion function, and recognizes the integral 23.

The sequence controlled by the controller 1 will be described below.

First, the controller 1 sets the addition/subtraction circuit 18 for addition, and initiates driving for infrared light emission. The integration circuit 22 continues integration of the addition output of the addition/subtraction circuit 18, while the controller 1 memorizes the integration time period (the number of times of blinking during the infrared light emission) taken until the integral 23 reaches a predetermined voltage value.

Then, after the controller 1 resets the integration circuit 22, it sets the addition/subtraction circuit 18 for subtraction and again initiates driving for infrared light emission.

The integration circuit 22 integrates the subtraction output of the addition/subtraction circuit 18 during only the integration time period which has been memorized during the above-described addition. The resultant integral 23 is A/D converted by an A/D converter included in the controller 1, and the digital value is evaluated by the controller 1.

The controller 1 determines the direction of rotation of a motor 24 in accordance with the polarity of such a value and also makes a decision as to the driving speed of a photographic lens and the state of focus on the basis of the absolute value of the value. More specifically, in the case of positive polarity, the photographic lens is made to move forward or, in the case of negative polarity, backward. If the value is near zero, the driving speed is reduced, and if it is approximately zero, the driving is stopped.

FIG. 2 is a block diagram showing the mechanism of an automatic focus adjustment device provided with the above-described circuit having the construction of FIG. 5. In FIG. 2, the same reference numerals are used to denote elements which are substantially identical to those shown in FIG. 5. The mechanism shown in FIG. 2 includes a photographic lens 31, an interlock cam 33 arranged integrally with the photographic lens 31 and movable in either of the directions indicated by an arrow 41 by the drive of the motor 24, and a sensor board 34 to which the light receiving sensors 12a and 12b are fixed. The sensor board 34 moves in a direction perpendicular to the optical axis in interlocking relation to the movement of the cam 33 along the optical axis. An image sensor is indicated by reference numeral 32. Incidentally, if the present invention is to be applied to a silver-salt camera, a film may be substituted for the image sensor 32. The received infrared light 11 (spot light) is made uniformly incident on both of the sensors 12a and 12b when the photographic lens 31 is in focus, whereas if the photographic lens 31 is out of focus, the incident spot light is shifted toward either one of the sensors 12a and 12b, depending on whether the state of focus is near focus or far focus. Thus, the photographic lens 31 is made to move on the basis of the integral output evaluated by the controller 1, whereby the position of the photographic lens 31 is adjusted to coincide with a position where the spot light is uniformly incident on the sensors 12a and 12b, i.e., a position where the photographic lens 31 is in focus.

FIG. 3 is a circuit diagram showing a conventional example of the sensor amplifier 14a.

The shown circuit is a circuit in which the feedback impedance of an operational amplifier G1 is provided with a band-pass characteristic. Since two resistors R3 and R4 and one capacitor C3 are only required besides a resistor R1 for setting gain relative to a signal, the circuit can be realized at low cost.

However, since noise (particularly, high-frequency noise) occurring at the input of the amplifier itself is amplified because of the characteristic of the circuit, a good S/N ratio is not obtained.

FIG. 4 is a circuit diagram showing another conventional example of the sensor amplifier 14a. In the circuit of FIG. 4, if a current iIN from the sensor 12a increases, an output voltage vOUT of the operational amplifier G1 decreases and the collector current of the transistor Q3 flows due to the characteristic thereof. This current is smoothened by a capacitor C4, and is fed back to the inverting input terminal of the operational amplifier G1 by a current mirror (Q4 and Q5), whereby only a DC component of the current from the sensor 14a is by-passed.

As described above, the circuit of FIG. 4 has the function of selectively compressing the output voltage with respect to the input current.

This circuit does not have a noise-amplification characteristic such as that of the conventional example of FIG. 3, and can achieve good direct-current elimination capability. However, a somewhat complicated circuit construction which employs a plurality of transistors and a few capacitors is needed, and if a discrete arrangement is adopted, mounting space and cost will become unnegligible.

On the other hand, if a monolithic IC including an operational amplifier is adopted, the problem of the number of transistors or capacitors used may be solved. However, since such an IC requires a terminal for externally mounting a capacitor of large capacity, the cost of the IC will increase by the cost of such a terminal.

SUMMARY OF THE INVENTION

It is, therefore, an object of the present invention to provide a sensor amplifier which can realize good direct-current elimination capability with a small circuit scale.

To achieve the above object, according to one aspect of the present invention, there is provided a sensor amplifier including an operational amplifier having an inverting input terminal which receives an output from a light receiving sensor and having a feedback impedance connected between the inverting input terminal and an output terminal of the operational amplifier. In the sensor amplifier, a series arrangement made up of a transistor and a resistor is connected between the output terminal and the inverting input terminal of the operational amplifier, and the transistor has a collector connected to the inverting input terminal and an emitter connected to one end of the resistor. A capacitor is connected between the base and the emitter of the transistor, and a constant voltage is applied to the base of the transistor.

The above and other objects, features and advantages of the present invention will become apparent from the following detailed description of preferred embodiments of the present invention, taken in conjunction with the accompanying drawings.

DETAILED DESCRIPTION OF THE PREFERRED EMBODIMENTS

Figure 1:
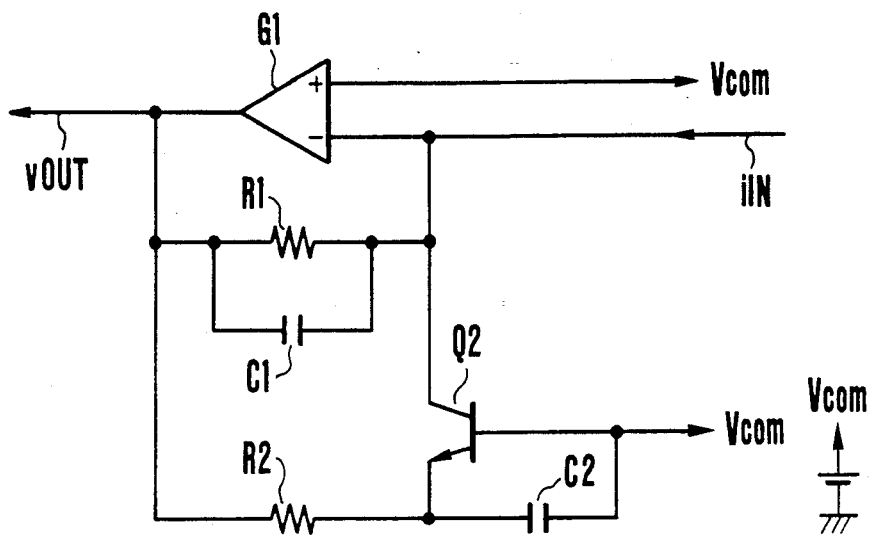
FIG. 1 is a circuit diagram schematically showing an embodiment of a sensor amplifier according to the present invention.
Figure 2:
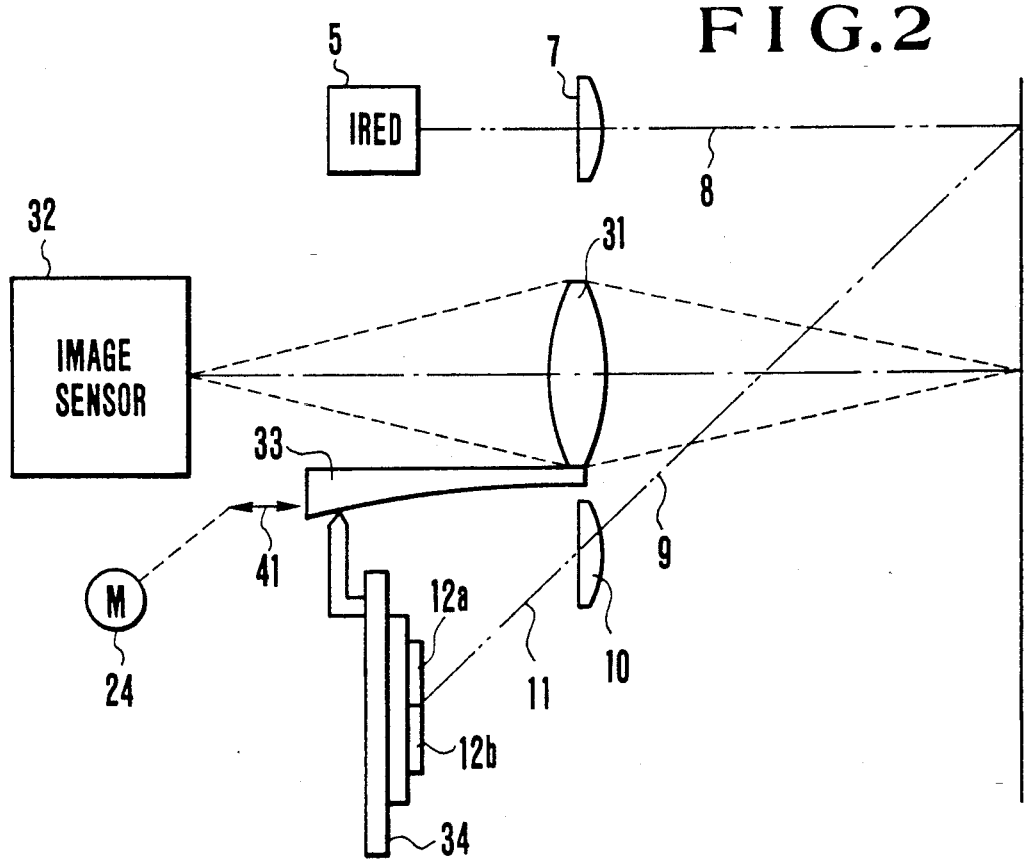
FIG. 2 is a construction diagram schematically showing the mechanism of an automatic focus adjustment device which adopts a sensor amplifier.
Figure 3:
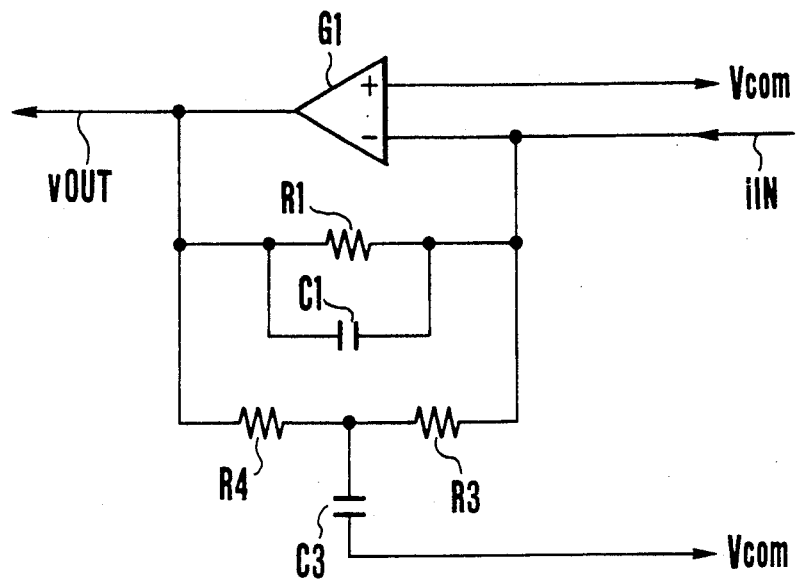
FIG. 3 is a circuit diagram schematically showing a conventional sensor amplifier.
Figure 4:
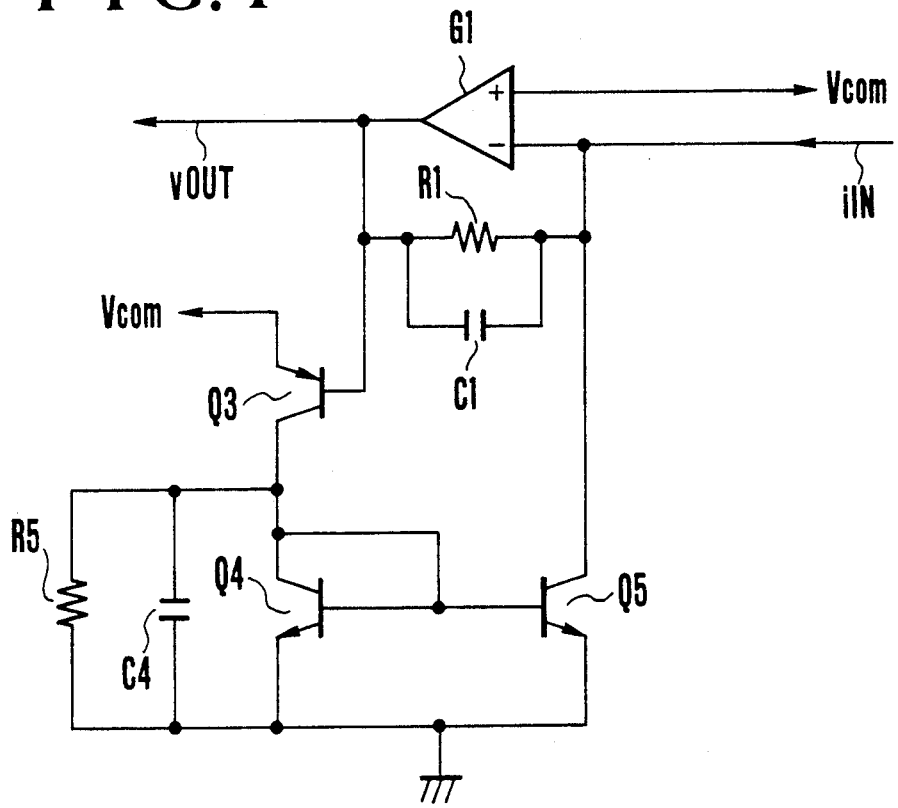
FIG. 4 is a circuit diagram schematically showing another example of the conventional sensor amplifier.
Figure 5:
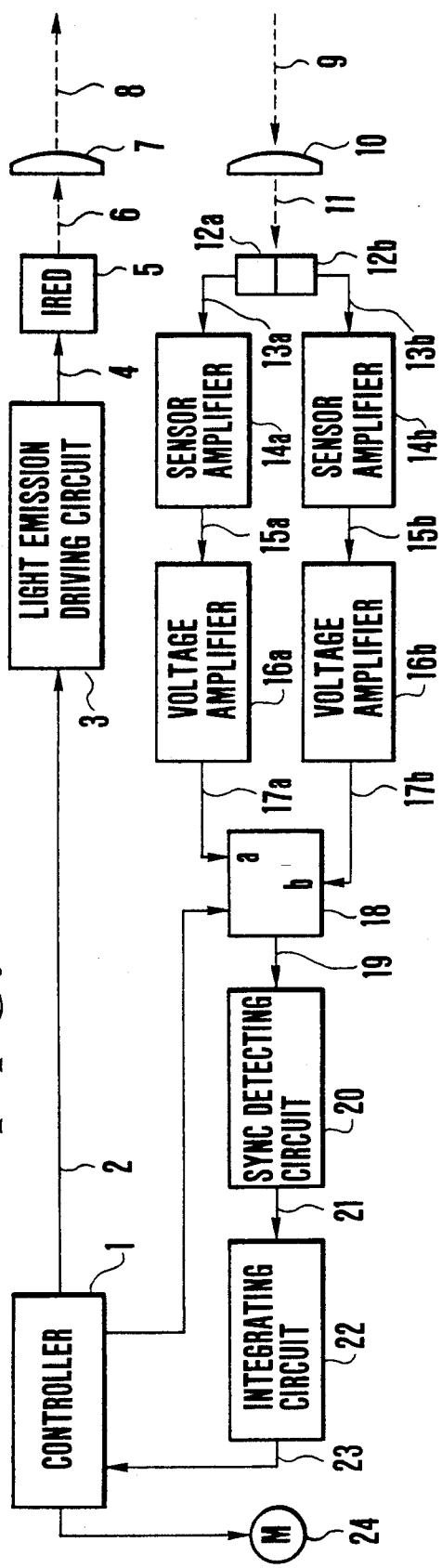
FIG. 5 is a circuit diagram schematically showing the circuit construction of a general automatic focus adjustment device which adopts a sensor amplifier.

FIG. 1 is a circuit diagram schematically showing an embodiment of a sensor amplifier according to the present invention.

In FIG. 1, an element G1 is an operational amplifier, and an output vOUT of the operational amplifier G1 is coupled to the emitter of a transistor Q2 via a linear low-pass filter consisting of a resistor R2 and a capacitor C2. A sensor output iIN is applied to the inverting input terminal of the operational amplifier G1.

The base of the transistor Q2 is connected to a constant-voltage source Vcom and the collector, to the inverting input terminal of the operational amplifier G1. The capacitor C2 is connected between the emitter and the base of the transistor Q2.

In the shown circuit, a low-frequency component passed through the low-pass filter is fed back to the operational amplifier G1, and the amount of direct current to be fed back is determined by the output voltage vOUT of the operational amplifier G1, the value of the resistor R2 and the base-emitter voltage of the transistor Q2. Accordingly, in the above-described embodiment, it is possible to provide an output of good S/N characteristic without noise amplification by means of a small-scale circuit.

The above description of the embodiment refers to the device in which an SPD (silicon photodiode) consisting of two sensor parts is employed as the light receiving sensor assembly. However, the present invention is also applicable to a device using a PSD (position-sensitive diode).

As another part construction, a general-purpose operational amplifier may be combined with discrete parts, or they may be formed as a monolithic IC.

Figure 6:
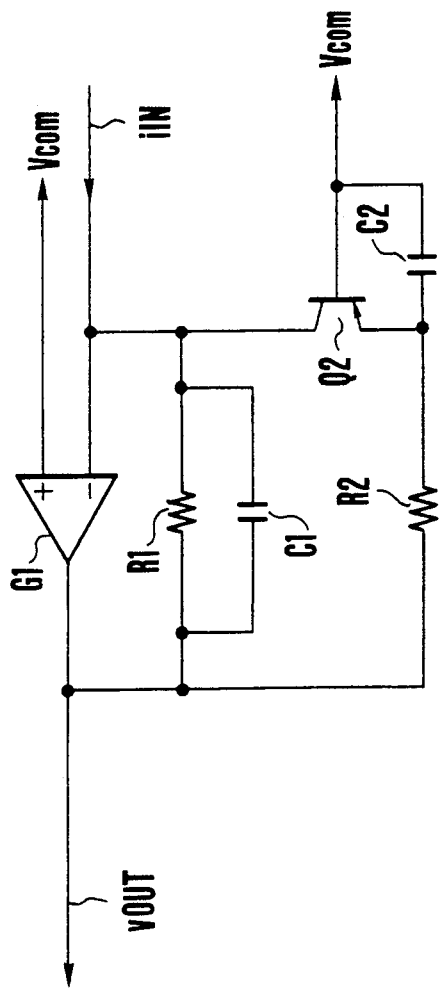
FIG. 6 is a circuit diagram schematically showing another embodiment of the sensor amplifier according to the present invention.

FIG. 6 is a circuit diagram schematically showing another embodiment of the present invention. The embodiment of FIG. 6 only differs from the embodiment of FIG. 1 in that the transistor Q2 is of a PNP type. The transistor Q2 may be an amplification device such as an FET instead of a bipolar transistor.

The above description of each of the embodiments refers to the example which utilizes the sensor amplifier as an automatic focus adjustment device. However, it is a matter of course that such an amplifier can be utilized for other applications.

As is apparent from the foregoing description, with either of the embodiments of the sensor amplifier according to the present invention, it is possible to realize a good direct-current elimination effect with a small-scale circuit.

What is claimed is:

1. An amplifying circuit for amplifying an input signal, comprising:
   (a) an operational amplifier having a first input terminal to which the input signal is input, a second input terminal to which a constant voltage is applied, and an output terminal;
   (b) a series arrangement composes of a resistor and a transistor, with one terminal of the resistor being connected to the output terminal of the operational amplifier, the other terminal of the resistor being connected to an emitter of the transistor, and a collector of the transistor being connected to the first input terminal of the operational amplifier, and a constant voltage being added to a base of the transistor; and
   (c) a capacitor connected between the emitter and base of the transistor,
whereby said operational amplifier operates to maintain a constant feed-back amount for a high-frequency component of the input signal and operates to increase a feed back amount for a low frequency component of the input signal, resulting in improved signal-to-noise ratio of the amplifying circuit.

2. An amplifying circuit according to claim 1, further comprising a parallel arrangement of a resistor and a capacitor connected in parallel to the series arrangement of the resistor and capacitor.

3. An amplifying circuit according to claim 1, wherein the transistor is a PNP type transistor.

4. An amplifying circuit according to claim 1, wherein the transistor is an NPN type transistor.

* * * * *